United States Patent [19]

Takayama

[11] Patent Number: 4,535,301
[45] Date of Patent: Aug. 13, 1985

[54] HIGH FREQUENCY AMPLIFIER CIRCUIT
[75] Inventor: Kazuo Takayama, Hyogo, Japan
[73] Assignee: Fujitsu Ten Limited, Hyogo, Japan
[21] Appl. No.: 515,171
[22] Filed: Jul. 19, 1983
[30] Foreign Application Priority Data Jul. 28, 1982 [JP] Japan ................................ 57-131598

[51] Int. Cl.³ .............................................. H03G 3/10
[52] U.S. Cl. .................................... 330/279; 330/282; 330/305
[58] Field of Search ............... 330/305, 306, 279, 277, 330/293, 282, 300

[56] References Cited

U.S. PATENT DOCUMENTS 4,275,361 6/1981 Schürmann ........................ 330/279
4,353,036 10/1982 Hoover ............................... 330/277
4,366,450 12/1982 Suganuma ............................ 330/277

Primary Examiner—James B. Mullins
Assistant Examiner—G. Wan
Attorney, Agent, or Firm—Wenderoth, Lind & Ponack

[57] ABSTRACT

A high frequency amplifier circuit includes a series resonance circuit resonating at a desired frequency, first transistor to the gate of which are applied signals and to the source of which is connected the series resonance circuit, a second transistor to the base of which is applied the output signal from the first transistor, and third and fourth transistors having their emitters connected to the second transistor. The collector of the third transistor is connected to the source of the first transistor. A parallel resonance circuit resonates at the desired frequency. The collector of the fourth transistor is connected to the source of the first transistor via the parallel resonance circuit. An AGC circuit applies AGC voltage to the bases of the third and fourth transistors for the purpose of varying the collector current ratio of both the transistors. Negative feedback is accomplished in the circuit, and output power is obtained from the parallel resonance circuit.

1 Claim, 5 Drawing Figures

HIGH FREQUENCY AMPLIFIER CIRCUIT

BACKGROUND OF THE INVENTION

1. Field of the Invention

The present invention relates to a radio receiver, or more particularly to a high frequency amplifier circuit of an electronically-tuned, car-mounted AM radio with improved characteristics at a large input.

2. Description of the Prior Art

In an electronically-tuned radio receiver a variable capacity diode is used as the channel selection element. The diode produces nonlinear distortions, because the capacity varies with the voltage applied. Since the antenna is capacitive in a car-mounted radio, the diodes and the antenna cannot be directly combined to compose a tuning circuit. Accordingly, an input circuit as shown in FIGS. 1 or 2 is used. In FIG. 1 an antenna is connected to a terminal 10, the antenna output is amplified by a field effect transistor 12, and a LC resonance circuit 14 is used for turning. A high frequency amplifier 16 is connected to the LC resonance circuit, and the output from the high frequency amplifier 16 is provided to a resonance circuit 18. The output of the circuit 18 is introduced into a mixer MIX in the next stage. AGC voltage is applied to the amplifier 16, and also the transistor 12 by way of a resistance 20. Since this circuit is of the untuned input type and unncessary waves are fed into the transistor 12 and amplified together with desired waves, the characteristics at large inputs, especially cross modulation characteristics, are inferior.

In FIG. 2, a resonance circuit 22 and a negative feedback resistance 30 are connected to the source of the transistor 12, in which when desired waves are applied, the circuit 22 resonates and the impedance becomes zero so that negative feedback is not applied, and when unnecessary waves are fed, a negative feedback is applied so that the wave will not be amplified as much. As a result, the performance is improved with respect to disturbance waves (unnecessary waves), but the following problems occur. Desired waves are free from negative feedback and are amplified by the transistor 12. Since gm of the transistor 12 is nonlinear and finite, and the Q and gain of resonance circuits 14, 22 depend on gm, the cross modulation characteristics are not sufficient. In particular, when the resonance circuit 14 resonates at desired waves, the resonance circuit 22 falls to zero impedance and receives a high voltage, so that the varactor diode used as its capacitive element builds up a large nonlinear distortion. Yet in this circuit, since it is difficult to apply negative feedback to the input side of transistor 12, the transistor 24 is connected to the output side as an attenuator. In this arrangement, however, the transistor 24 lowers the Q of resonance circuit 14, and its own nonlinear form is introduced into the circuit.

SUMMARY OF THE INVENTION

The object of this invention is to provide an antenna input circuit exhibiting excellent cross modulation characteristics by improving the problems stated above. The high frequency amplifier circuit of the present invention comprises a first transistor in which input signals are applied to its gate and a series resonance circuit resonating a desired frequency is connected to its source, and third and fourth transistors having their emitters connected to a common second transistor, wherein the output of the first transistor is applied to the base of the second transistor, and the collector of the third transistor and that of the fourth transistor are connected to the source of the first transistor directly and by way of a parallel resonance circuit resonating at said desired frequency, respectively, so as to apply negative feedback, and an AGC voltage is applied to the bases of the third and fourth transistors in order to vary the collector current ratio of these transistors, so that the output may be obtained from the parallel resonance circuit.

According to this invention, as explained above, since the cross modulation reduced in spite of untuned input type composition, the AGC voltage can be applied without introducing nonlinear distortion, and the gain is high, the circuit is very useful when applied in a car-mounted radio receiver.

DETAILED DESCRIPTION OF THE PREFERRED EMBODIMENT

Referring now to an embodiment shown in FIG. 3, the principle of the present invention is described below.

Figure 1:
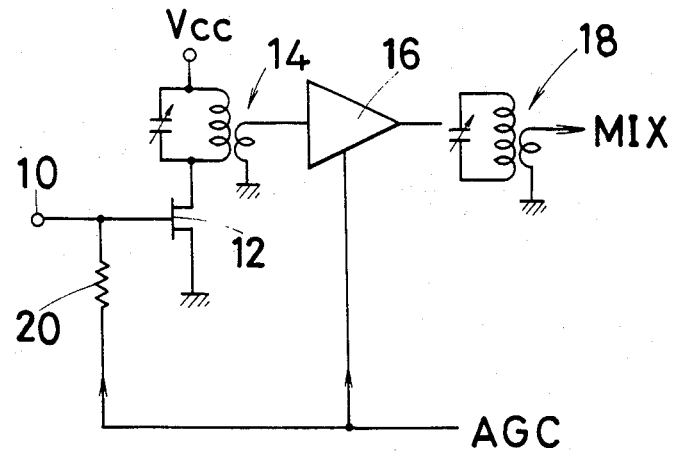
FIGS. 1 and 2 are circuit diagrams representing conventional examples.
Figure 2:
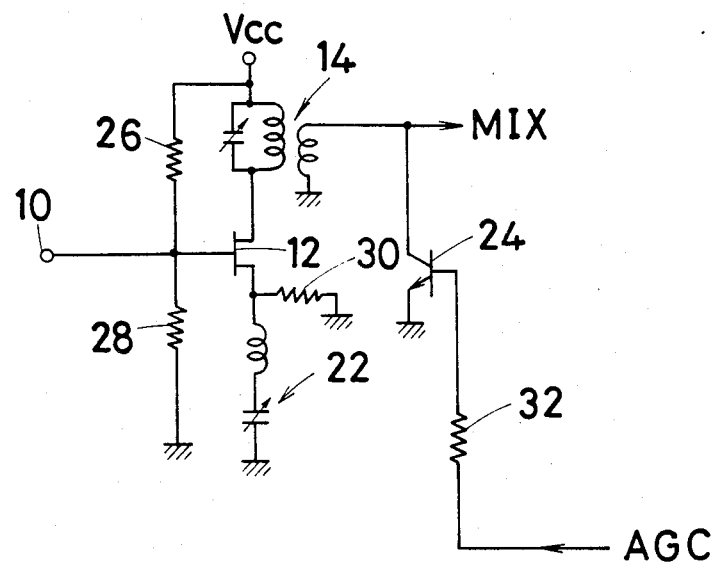
Figure 3:
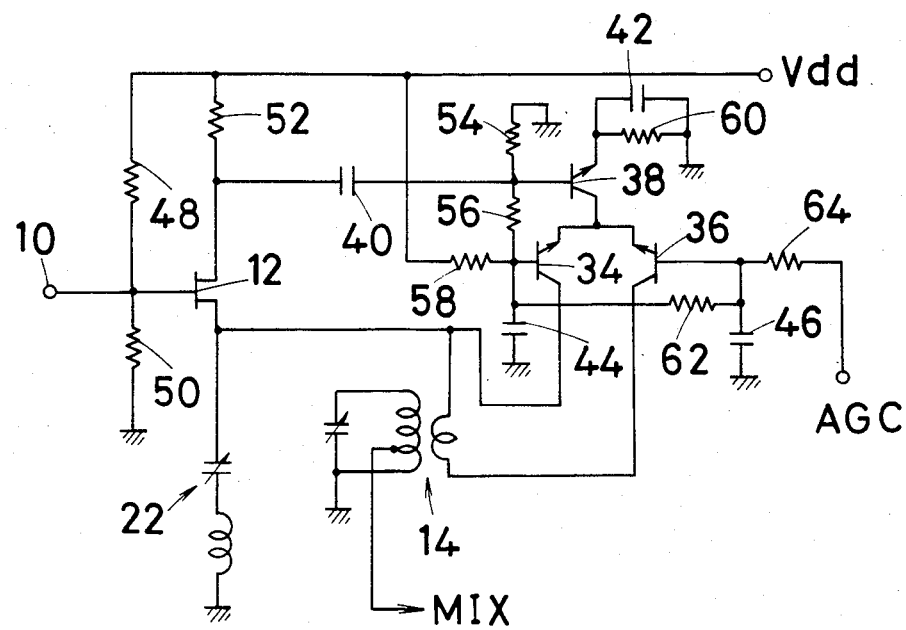
FIG. 3 is a circuit diagram showing an embodiment of the present invention.
Figure 4:
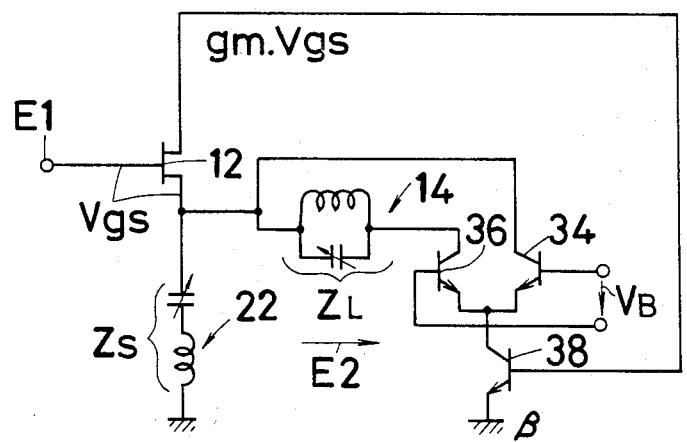
FIG. 4 is an equivalent circuit of FIG. 3.

In FIG. 3, reference numeral 12 shows a field effect transistor and reference numerals 14 and 22 show resonance circuits. Reference numerals 34 and 36 show differential transistors having their emitters connected together, and a transistor 38 is connected to this common emitter circuit. The output of transistor 12 is applied to the base transistor 38. The collector of the transistor 34 and that of transistor 36 are connected to the source of transistor 12 directly and by way of the parallel resonance circuit 14, respectively, so that a negative feedback may be applied. Reference numerals 40, 42, 44 and 46 show capacitors, and 48, 50, 52, 54, 56, 60, 62 and 64 show resistors, Vdd represents the supply voltage, and the current due to this voltage flow in the route of 52, 12 and 34; 52, 12 and a primary coil of 14; 36, 38 and 60; 48 and 50; 58 and the base of 34; and 58, 62 and base of 36. An equivalent circuit of these routes is shown in FIG. 4. As shown in the diagram of FIG. 4, supose the gate-source voltage of transistor 12 to be Vgs, the current flowing in the drain is gm·Vgs, and suppose the current amplification factor of transistor 38 to be $\beta$, the current flowing in the emitter of this transistor is gm·Vgs·$\beta$. Since both the currents flow into the series resonance circuit 22, the following equation is obtained assuming the impedance of the resonance circuit to be Zs and input voltage to be E1.

$$E1 = Vgs + gm \cdot Vgs \, (1+\beta) \, Zs \tag{1}$$

Supposing the impedance of parallel resonance circuit 14 to be $Z_L$ and output voltage E2, the following equation is given.

$$E2 = gm \cdot Vgs \cdot \beta \cdot KZL \tag{2}$$

where K is the current dividing ratio, and 1/K is approximately represented by $$\left(1 + e^{-\frac{qVB}{KT}}\right),$$

which varies with the bias voltage VB. Equations (1) and (2) may be combined to yield the following formula.

$$E2 = E1 \cdot gm \cdot \beta \cdot ZL \cdot K / \{1 + gm\,(1+\beta)\,Zs\} \quad (3)$$

Since $\beta$ is about 100 and by far greater than 1, equation (3) may be rewritten as $$E2 \approx E1 \cdot ZL \cdot K / Zs \quad (4)$$

Therefore, when the current dividing ratio K is constant, the gain is determined by the ratio of impedance Zs to ZL. Since the gain does not contain parameters such as gm and $\beta$ of the transistor, it is extremely stable and is almost free of nonlinear properties, which shows the excellence in cross modulation characteristics. Meanwhile, since the impedances Zs and ZL of circuits 14, 22 at the resonance frequency are expressed by Q, the equation (4) may be rewritten as $$E2 \approx E1 \cdot Q1 \cdot Q2 \cdot K \quad (5)$$

which shows the gain is considerably large. When the gain is large, AGC is required, and it may be adjusted by varying the current dividing ratio K. The AGC voltage applied to the base of transistor 36 through resistor 64 in FIG. 3 is this control voltage. The value of K is nonlinear with respect to the voltage VB as mentioned above, and since it is stable to the input signal, it will not cause cross modulation. Also in this circuit, at the resonance frequency, that is at the desired frequency, the impedance of the series resonance circuit 22 is extremely decreased, while the impedance of the parallel resonance circuit 14 is extremely increased, so that negative feedback is unlikely to occur but is applied sufficiently when deviating from the desired frequency, thereby reducing the gain. Thus, the selectivity is excellent.

Figure 5:
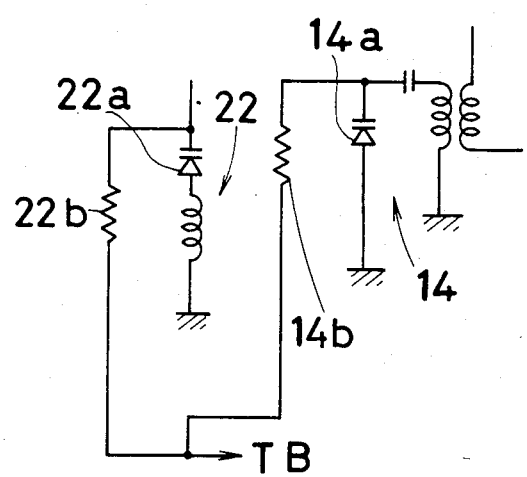
FIG. 5 is a circuit diagram indicating a partly modified example.

As the variable capacity of tuning circuits 14, 22, aside from ordinary mechanical variable capacitors, varactor diodes also may be used. FIG. 5 shows an example of a circuit of important parts where varactor diodes are used, in which 14a, 22a are varactor diodes, TB is a bias power source, and 14b, 22b are current limiting resistors.

What is claimed is:

1. A high frequency amplifier circuit comprising:
   a series resonance circuit resonating at a desired frequency,
   a first transistor to the gate of which signals are applied and to the source of which is connected said series resonance circuit,
   a second transistor to the base of which is applied an output signal from said first transistor,
   third and fourth transistors having their emitters connected to said second transistor,
   the collector of said third transistor being connected to said source of said first transistor,
   a parallel resonance circuit resonating at said desired frequency,
   the collector of said fourth transistor being connected to said source of said first transistor via said parallel resonance circuit, and
   an AGC circuit for applying AGC voltage to the bases of said third and fourth transistors for the purpose of varying the collector current ratio of both said third and fourth transistors,
   whereby negative feedback is accomplished and output power is obtained from said parallel resonance circuit.

* * * * *